(12) United States Patent
Pedersen (10) Patent No.: US 8,125,366 B2
(45) Date of Patent: Feb. 28, 2012

(54) INTEGRATING (SLOPE) DAC ARCHITECTURE

(75) Inventor: Trond Jarle Pedersen, Saupstad (NO)

(73) Assignee: Atmel Corporation, San Jose, CA (US)

( * ) Notice: Subject to any disclaimer, the term of this patent is extended or adjusted under 35 U.S.C. 154(b) by 83 days.

(21) Appl. No.: 12/829,354

(22) Filed: Jul. 1, 2010

(65) Prior Publication Data

US 2012/0001784 A1 Jan. 5, 2012

(51) Int. Cl.
*H03M 1/82* (2006.01)
(52) U.S. Cl. .......... 341/152; 341/120; 341/144
(58) Field of Classification Search .......... 341/144, 341/120, 118, 122, 150, 135, 152
See application file for complete search history.

(56) References Cited

U.S. PATENT DOCUMENTS

| | | | | |
|---|---|---|---|---|
| 5,426,413 A * | 6/1995 | Gulczynski | .......... | 341/144 |
| 6,294,905 B1 * | 9/2001 | Schwartz | .......... | 323/288 |
| 6,320,528 B1 * | 11/2001 | Michel | .......... | 341/144 |
| 6,329,804 B1 * | 12/2001 | Mercer | .......... | 323/315 |
| 6,466,189 B1 * | 10/2002 | Albu et al. | .......... | 345/87 |
| 2004/0075462 A1 * | 4/2004 | Kizer et al. | .......... | 326/29 |

* cited by examiner

*Primary Examiner* — Peguy Jean Pierre
(74) *Attorney, Agent, or Firm* — Fish & Richardson P.C.

(57) ABSTRACT

A current source is used to pre-charge a capacitor to a known value. The capacitor can then be connected to a unity gain buffer to provide a low cost DAC. The DAC can include a self-calibration stage to improve accuracy. The DAC can include two or more circuit branches, each including a current source and a capacitor, where each branch can be calibrated and operated separately to reduce mismatch and to provide a continuous analog voltage output.

14 Claims, 9 Drawing Sheets

INTEGRATING (SLOPE) DAC ARCHITECTURE

TECHNICAL FIELD

This subject matter is generally related to electronics, and more particularly to digital-to-analog converter (DAC) architectures.

BACKGROUND

A digital-to-analog converter (DAC) is a device that converts a digital code (e.g., a binary code) into an analog signal. A conventional DAC architecture uses a sequence of numbers to update an analogue voltage at uniform sampling intervals. The sequence of numbers can be written to the DAC with a clock signal that causes each number to be latched in sequence, at which time the DAC output voltage changes from a previous value to a value represented by the currently latched number. The output voltage is held in time at the current value until the next input number is latched resulting in a piecewise constant shaped output. The piecewise constant shaped output or rectangular pulses can cause multiple harmonics above the Nyquist frequency, which can be removed with a reconstruction filter.

Other conventional DAC architectures, such as DAC methods based on Delta-sigma modulation produce a pulse-density modulated signal that can then be filtered to produce a smoothly varying signal.

These conventional DAC architectures typically are implemented as analog circuits and thus can consume a significant amount of current and silicon area, making such conventional DAC architectures unsuitable for some applications where a low cost DAC architecture is desired.

SUMMARY

A current source is used to pre-charge a capacitor to a known value. The capacitor can then be connected to a buffer to provide a low cost DAC. The DAC can include a self-calibration stage to improve accuracy. The DAC can include two or more parallel circuit branches, each including a current source and a capacitor, where each branch can be calibrated and operated separately to reduce mismatch and to provide a continuous analog voltage output.

DETAILED DESCRIPTION

Circuit Overview

Figure 1:
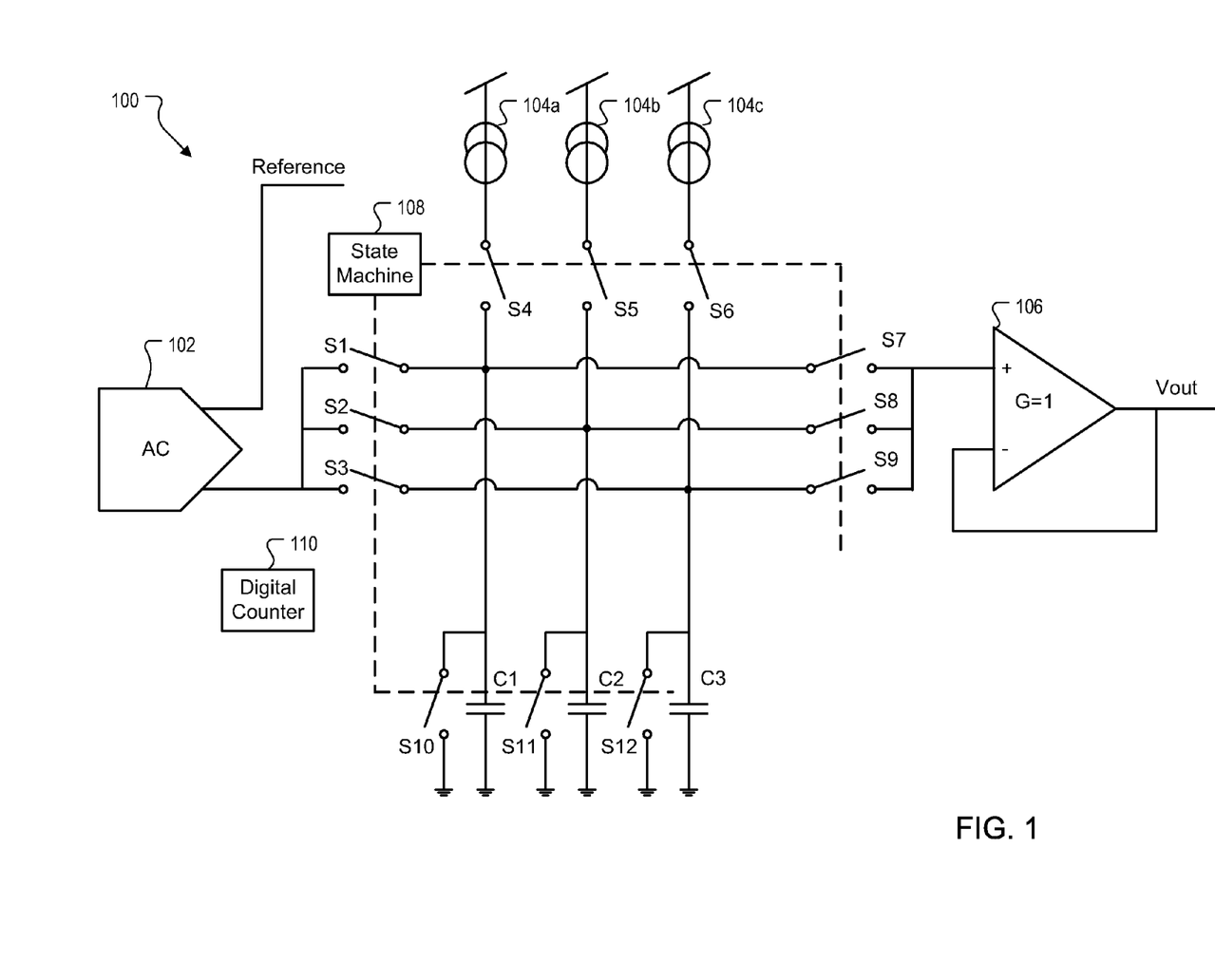
FIG. 1 is a simplified schematic diagram of an exemplary integrating DAC architecture.

FIG. 1 is a simplified schematic diagram of an exemplary integrating 3-bit DAC architecture 100. In some implementations, the architecture 100 can include an analog comparator 102, current sources 104a-104c (e.g., linear current sources), buffer 106, state machine 108, digital counter 110, switches S1-S12 and capacitors C1-C3. The architecture 100 can include multiple parallel circuit branches, each branch can include a current source and a capacitor. In the architecture shown, a first branch includes the current source 104a and the capacitor C1, a second branch includes the current source 104b and the capacitor C2 and a third branch includes the current source 104c and capacitor C3.

The architecture 100 can have two or more parallel branches, where at least two branches can be configured through switches to provide a continuous voltage output. In each branch switches are operable to connect and disconnect the current source to the capacitor and to short the capacitor to ground to remove charge on the capacitor. The current sources 104a-104c can be selected to be closely matched. In some implementations, an integrator can be used as a source, or capacitors and large resistors as pull-up sources, rather than current sources 104a-104c.

The state machine 108 can be implemented using a programmable logic device, a programmable logic controller, logic gates and flip flops or relays. In some implementations, a register can store state variables, a first block of combinational logic can determine the state transition, and a second block of combinational logic can determine the output of the state machine 108. The state machine 108, together with the digital counter 110, can be used to close and open the switches S1-S12 to affect various stages of circuit operation, as described in reference to FIGS. 2-7.

The digital counter 110 can be implemented using register-type circuits such as a flip-flop (e.g., Up-down counter), or any other known digital counter design.

Switches S1-S12 can be semiconductor switches (e.g., MOSFET transistors). The control inputs to the switches S1-S12 can be determined by the state machine 108.

The voltage reference connected to the analog comparator 102 can be any suitable voltage reference (e.g., zener reference, bandgap reference).

The buffer 106 can be an operational amplifier configured for unity gain. For example, a unity gain buffer amplifier may be constructed by applying a full series negative feedback to an op-amp by connecting its output to its inverting input, and connecting the signal source to the non-inverting input. Other known buffer designs also can be used.

The analog comparator 102 can be a standard op-amp operating in open loop configuration (without negative feedback) or a dedicated analog comparator integrated circuit chip (e.g., Atmel AVR1302 analog comparator).

Circuit Operation

Figure 2:
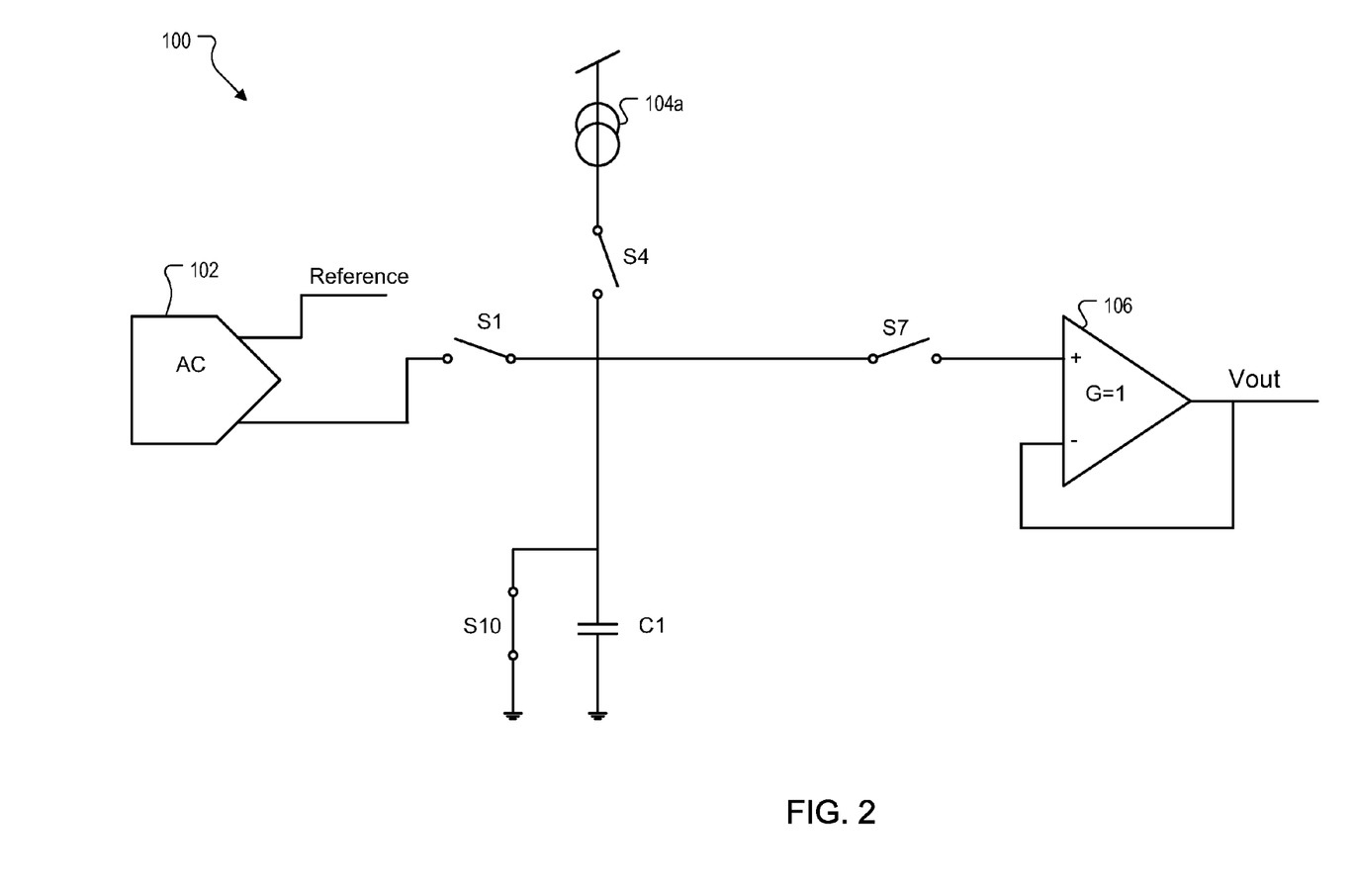
FIG. 2 is a simplified schematic diagram of a portion of the exemplary integrating DAC architecture of FIG. 1 illustrating charge removal and reset during a self-calibration stage.

FIG. 2 is a schematic diagram of a portion of the exemplary integrating DAC architecture of FIG. 1 illustrating capacitor charge removal and reset during a self-calibration stage. The portion includes the analog comparator 102, the first branch of architecture 100 (which includes current source 104a and capacitor C1), buffer 106 and switches S1, S4, S7, and S10. The analog comparator 102 is connected to a voltage reference.

The calibration stage can start by opening switches S1, S4 and S7 and closing switch S10. Opening switch S1 disconnects the analog comparator 102 from the first branch. Opening switch S4 disconnects the current source 104a from the capacitor C1. Opening switch S7 disconnects the buffer 106 from the branch. Closing switch S10 shorts the capacitor C1 to ground, thus removing any charge stored over the capacitor C1.

Figure 3:
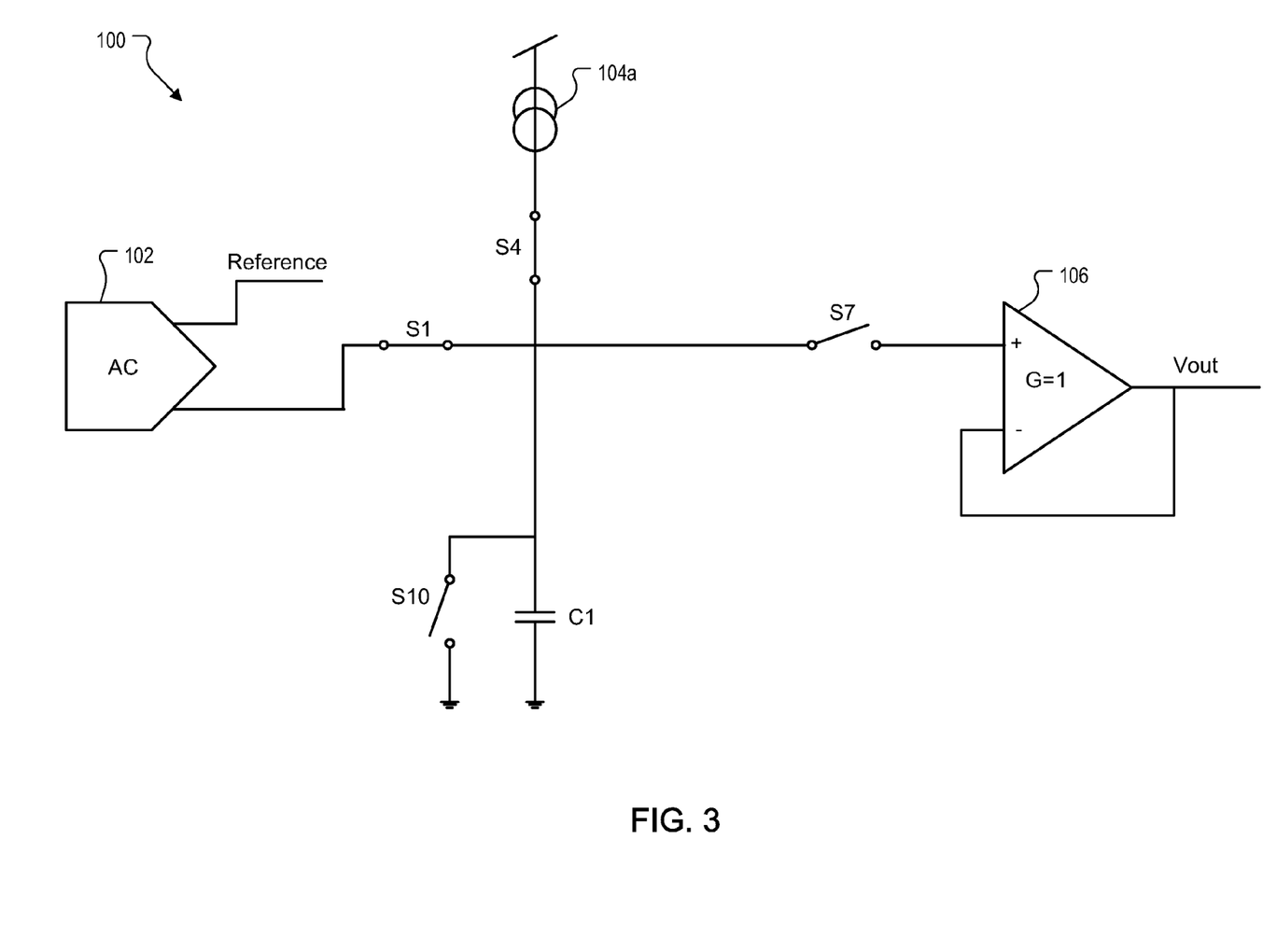
FIG. 3 is a simplified schematic diagram of a portion of the exemplary integrating DAC architecture of FIG. 2 illustrating the establishing of a reference during the self-calibration stage.

FIG. 3 is a schematic diagram of a portion of the exemplary integrating DAC architecture of FIG. 2 illustrating the establishing of a reference during the self-calibration stage. The calibration stage continues establishes a reference by opening switches S10 and S7 and closing switches S1, S4 and S10. Opening switch S10 disconnects the capacitor from ground so that it can be charged by the currents source 104a. Opening switch S7 disconnects the buffer 106 from the branch. Closing switch S1 connects the analog comparator 102 to the capacitor C1. Closing switch S4 connects the current source 104a to the capacitor C1.

In this configuration, the capacitor C1 is connected to the current source 104a and the capacitor C1 is charged while the digital counter 110 counts cycles until the voltage over the capacitor C1 is about equal to the reference voltage (or differs by a threshold amount), at which point the analog comparator 102 triggers and the digital count is stored (e.g., stored in a register).

A mathematical relationship can be established between the voltage over the capacitor and a digital value expressed as $$V_{count} = \frac{V_{reference}}{Digital_{count}}, \quad [1]$$

where $V_{count}$ is the voltage change from one cycle, $V_{reference}$ is the analog reference voltage and $Digital_{count}$ is the number of cycles counted by the digital counter 110. $V_{reference}$ can also be described as the voltage stored over the capacitor plus the offset error in the analog comparator 102.

The digital count can be normalized to a standard resolution using the following expression $$Digital_{count\_LSB} = \frac{Digital_{count}}{2^N}, \quad [2]$$

where $Digital_{count}$ LSB is the number of cycles per LSB step and N is the desired resolution and is a positive integer. Expression [2] provides the required number of cycles for a voltage charge corresponding to 1 LSB step.

Figure 4:
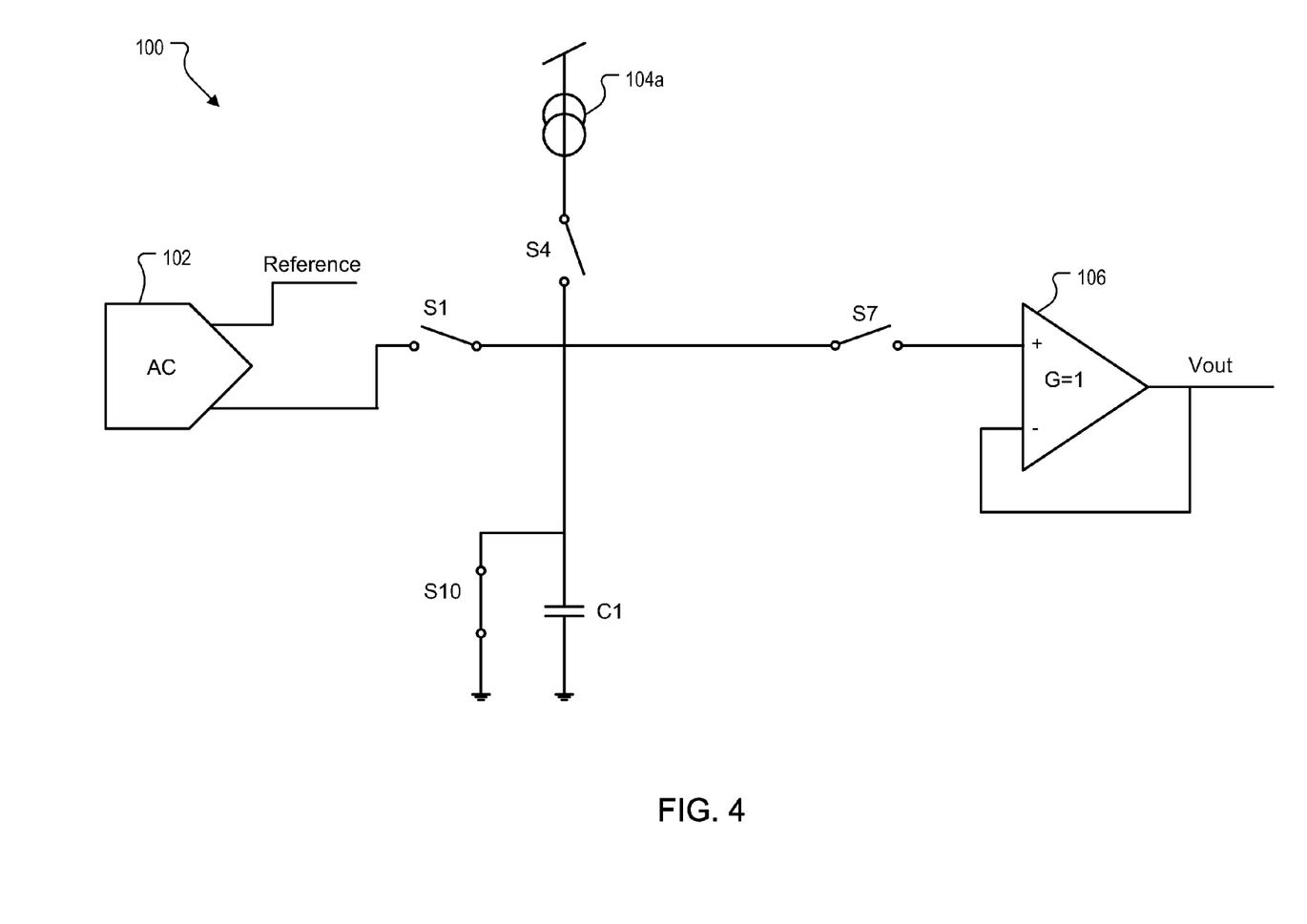
FIG. 4 is a simplified schematic diagram of a portion of the exemplary integrating DAC architecture of FIG. 2 illustrating charge removal and reset during a conversion stage.

FIG. 4 is a schematic diagram of a portion of the exemplary integrating DAC architecture of FIG. 2 illustrating charge removal and reset during a conversion stage. In the start of the conversion stage, switch S10 is closed and switches S1, S4 and S7 are opened. Switch S10 shorts the capacitor C1 to ground to remove any charge before the current source 104a is connected to the capacitor C1 and starts charging the capacitor C1.

Figure 5:
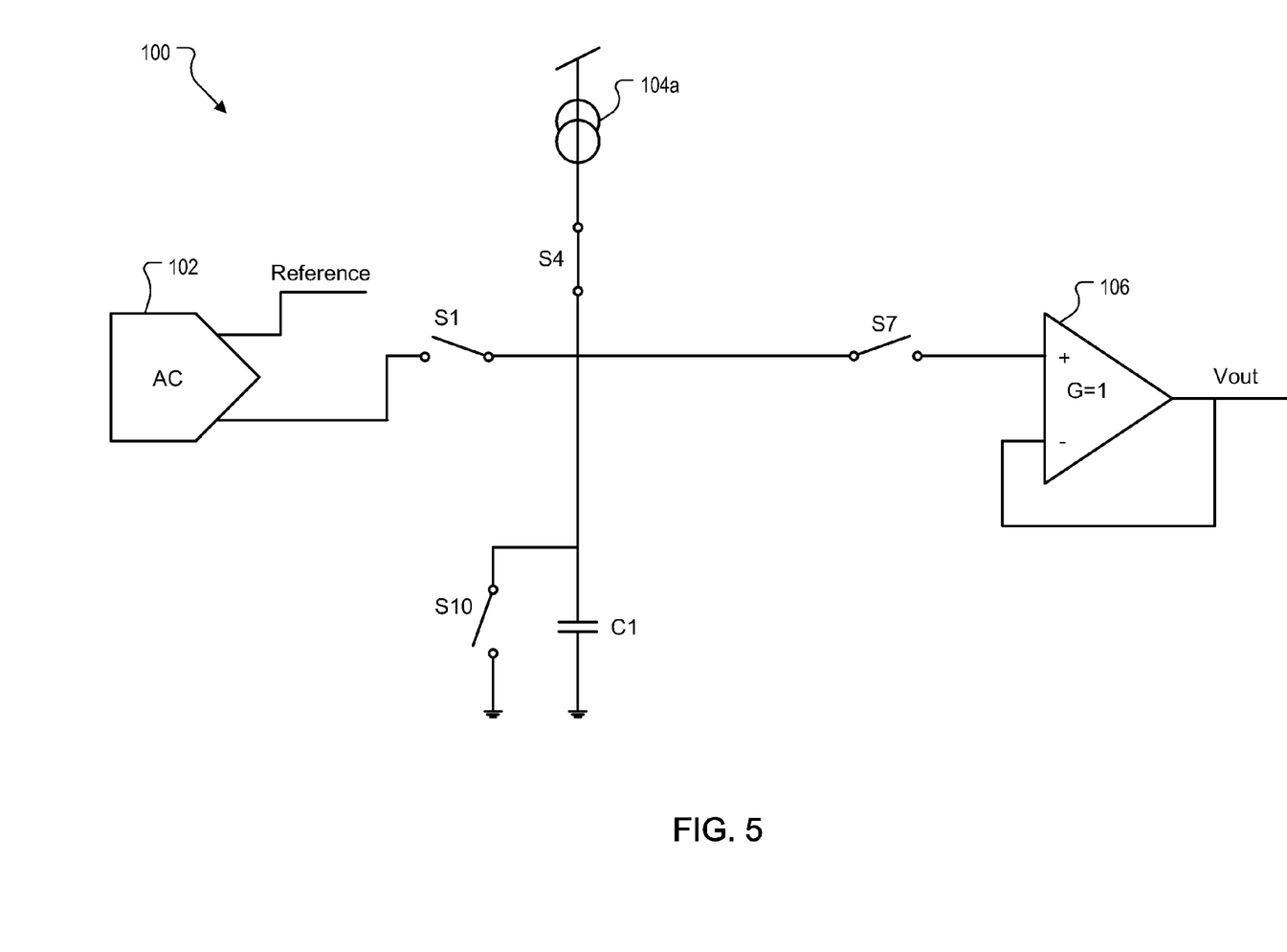
FIG. 5 is a simplified schematic diagram of a portion of the exemplary integrating DAC architecture of FIG. 1 illustrating setting a target analog voltage during a conversion stage.

FIG. 5 is a schematic diagram of a portion of the exemplary integrating DAC architecture of FIG. 1 illustrating setting a target analog voltage during a conversion stage. The conversion stage continues by opening switches S1, S10 and S7 and closing switch S4 to allow the current source 104a to charge the capacitor C1. The capacitor C1 is charged until a count by the digital counter 110 is equal to $Digital_{output\_count} \cdot Digital_{count\_LSB} \cdot V_{reference}$ described in expression [1] can also be described as the voltage stored over the capacitor C1. With this observation, expression [1] can lead to the following new expression:

$$Digital_{output\_count} \cdot V_{count} = V_{out}, \quad [3]$$

where $V_{out}$ is the output voltage after $Digital_{output\_count}$ cycles. Based on expression [3], the required cycles to reach the desired output voltage can be calculated.

Figure 6:
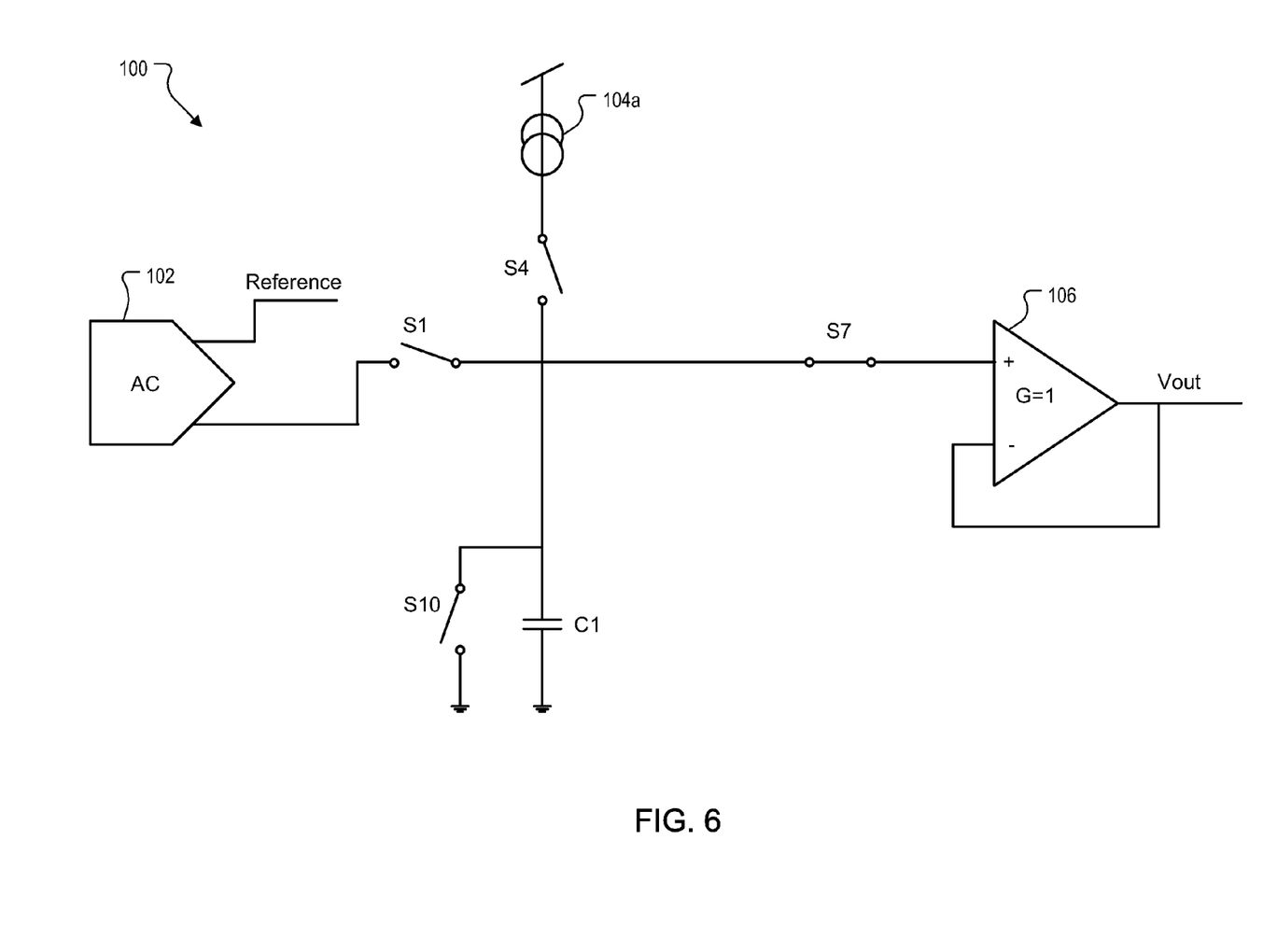
FIG. 6 is a simplified schematic diagram of a portion of the exemplary integrating DAC architecture of FIG. 2 illustrating setting an output voltage.

FIG. 6 is a schematic diagram of a portion of the exemplary integrating DAC architecture of FIG. 2 illustrating setting an output voltage. To set the output voltage, switches S1, S4 and S10 are opened and switch S7 (connected to the buffer 106) is closed. After charging the capacitor C1 to a target analog voltage, the charged capacitor C1 is connected to the unity output buffer 106, resulting in the voltage stored over the capacitor C1 being transferred to the buffer 106 where it is held at the output of the DAC.

Figure 7:
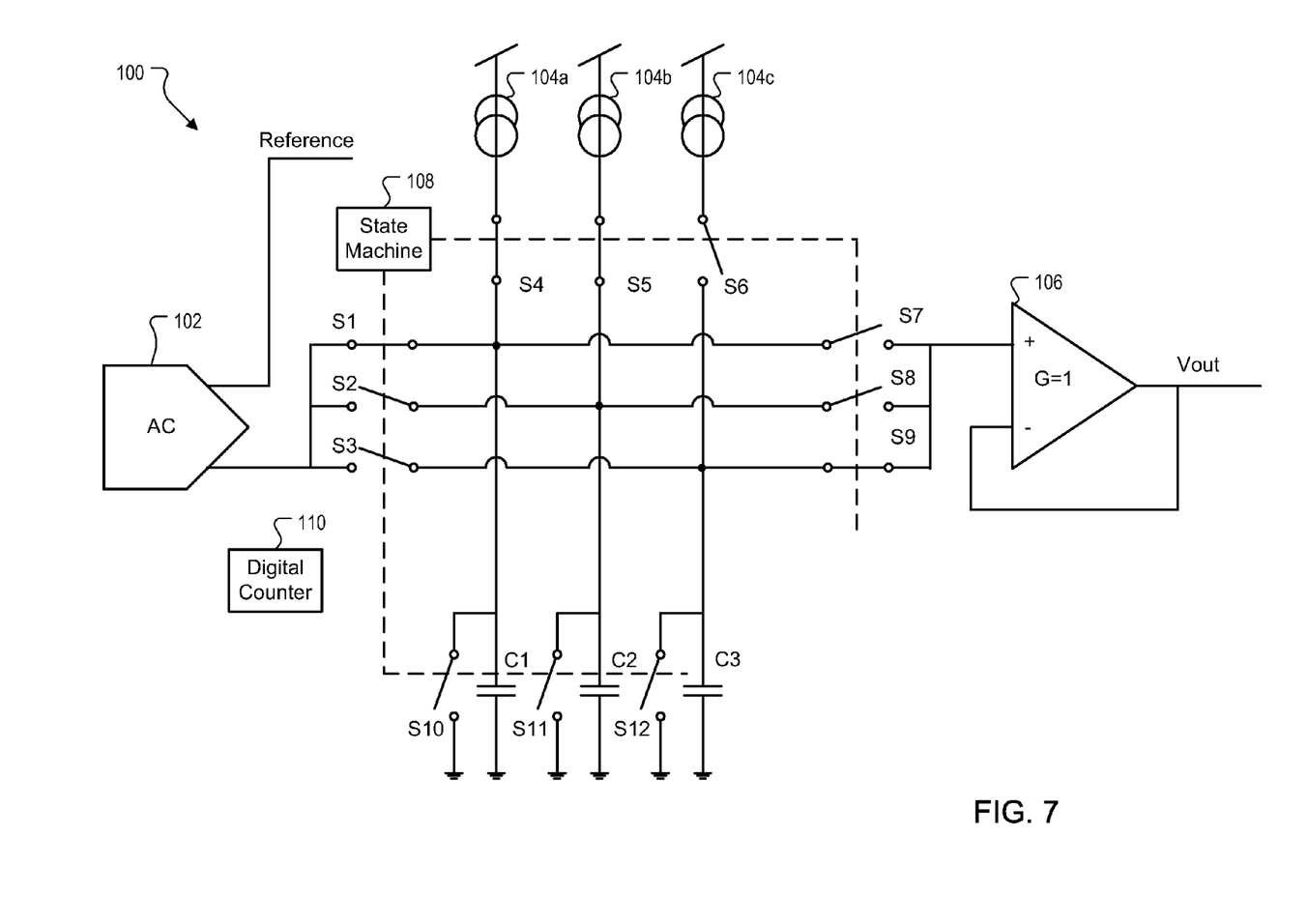
FIG. 7 is a simplified schematic diagram of an exemplary integrating DAC architecture illustrating multiple branches in different stages of operation to provide continuous output.

FIG. 7 is a schematic diagram of an exemplary integrating DAC architecture illustrating multiple branches in different stages of operation to provide continuous output. More particularly, FIG. 7 illustrates how two or more branches in architecture 100 can be in different stages of operation at the same time to ensure continuous output from the DAC. Since the branches are calibrated and operated separately, mismatch between the circuit elements in different branches do not affect operation.

In the present configuration, switches S1, S4, S5 and S9 are closed and switches S2, S3, S6, S7, S8, S10, S11 and S12 are opened. This configuration results in the first branch operating in the calibration stage, the second branch operating in the conversion stage, and the third branch setting the output voltage of the DAC. Table I below illustrates the states of switches S1–S12 for the various stages of operation for the 3 branches of the architecture 100 shown in FIG. 7.

TABLE I

Switch States (O = opened, C = closed)

| | Branch 1 | | | | Branch 2 | | | | Branch 3 | | | |
|---|---|---|---|---|---|---|---|---|---|---|---|---|
| Switches | S1 | S4 | S7 | S10 | S2 | S5 | S8 | S11 | S3 | S6 | S9 | S12 |
| Reset | O | O | O | C | O | O | O | C | O | O | O | C |
| Establish reference | C | C | O | O | C | C | O | O | C | C | O | O |
| Set analog voltage | O | C | O | O | O | C | O | O | O | C | O | O |
| Set output voltage | O | O | C | O | O | O | C | O | O | O | C | O |

Exemplary Calibration and Conversion Processes

Figure 8:
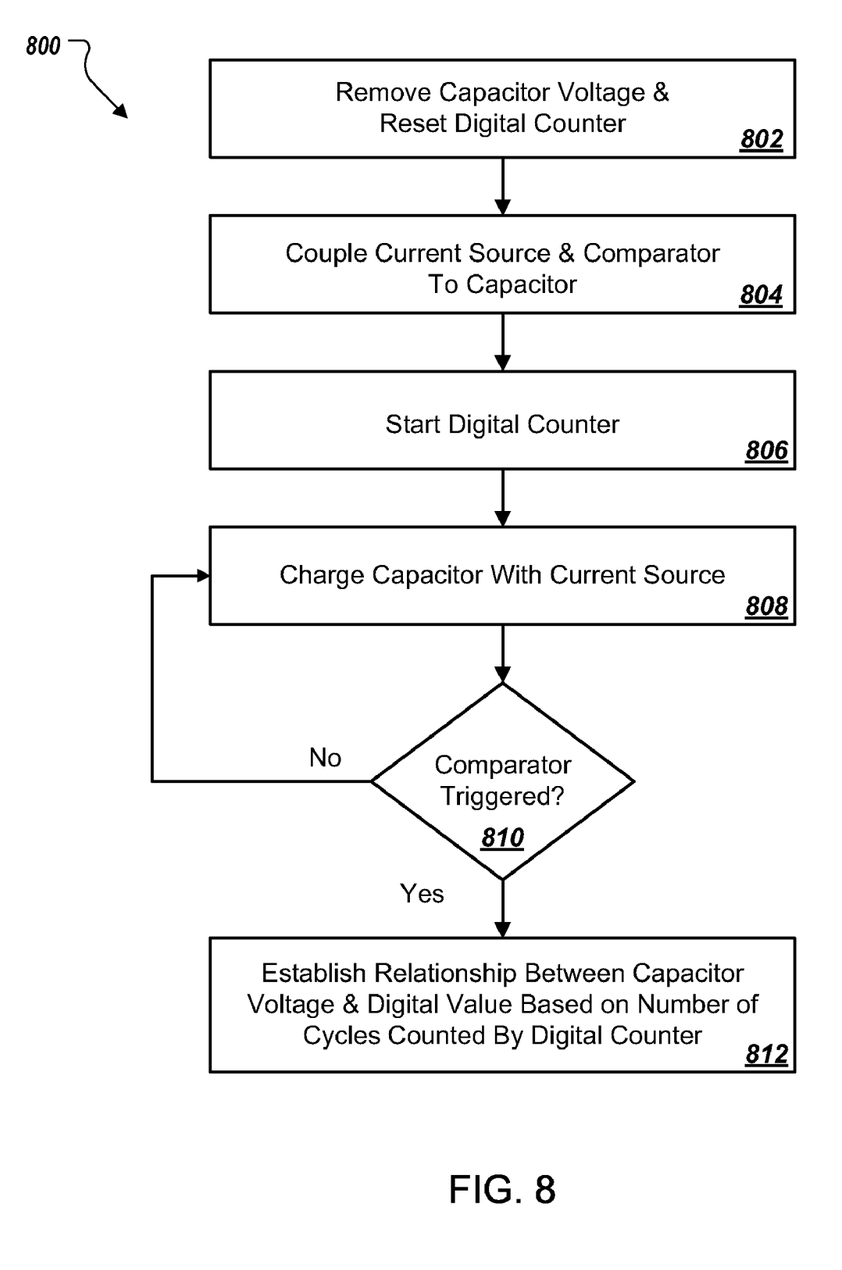
FIG. 8 is a flow diagram of an exemplary calibration process using an integrating DAC architecture.

FIG. 8 is a flow diagram of an exemplary calibration process 800 using an integrating DAC architecture. The process 800 can be operated independently in multiple branches of the integrating DAC architecture 100.

In some implementations, the process 800 begins by removing capacitor voltage and resetting a digital counter (802). For example, the capacitor voltage can be removed by shorting the capacitor to ground, as described in reference to FIG. 2. The current source and an analog comparator are connected to the capacitor (804). The digital counter is started (806).

After starting the digital counter (806), the current source charges the capacitor (808) until the voltage over the capacitor is about equal to a reference voltage or differs by a threshold amount. For example, the reference voltage and the capacitor can be input into the analog comparator that is configured to trigger when the capacitor voltage is about equal to the reference voltage. The trigger can be used to stop the digital counter. The count of the digital counter is the number of clock cycles completed when the comparator triggers.

When the analog comparator triggers (810), a mathematical relationship is established between the capacitor voltage at the time of the trigger and a digital value based on the number of cycles counted by the digital counter (812).

Figure 9:
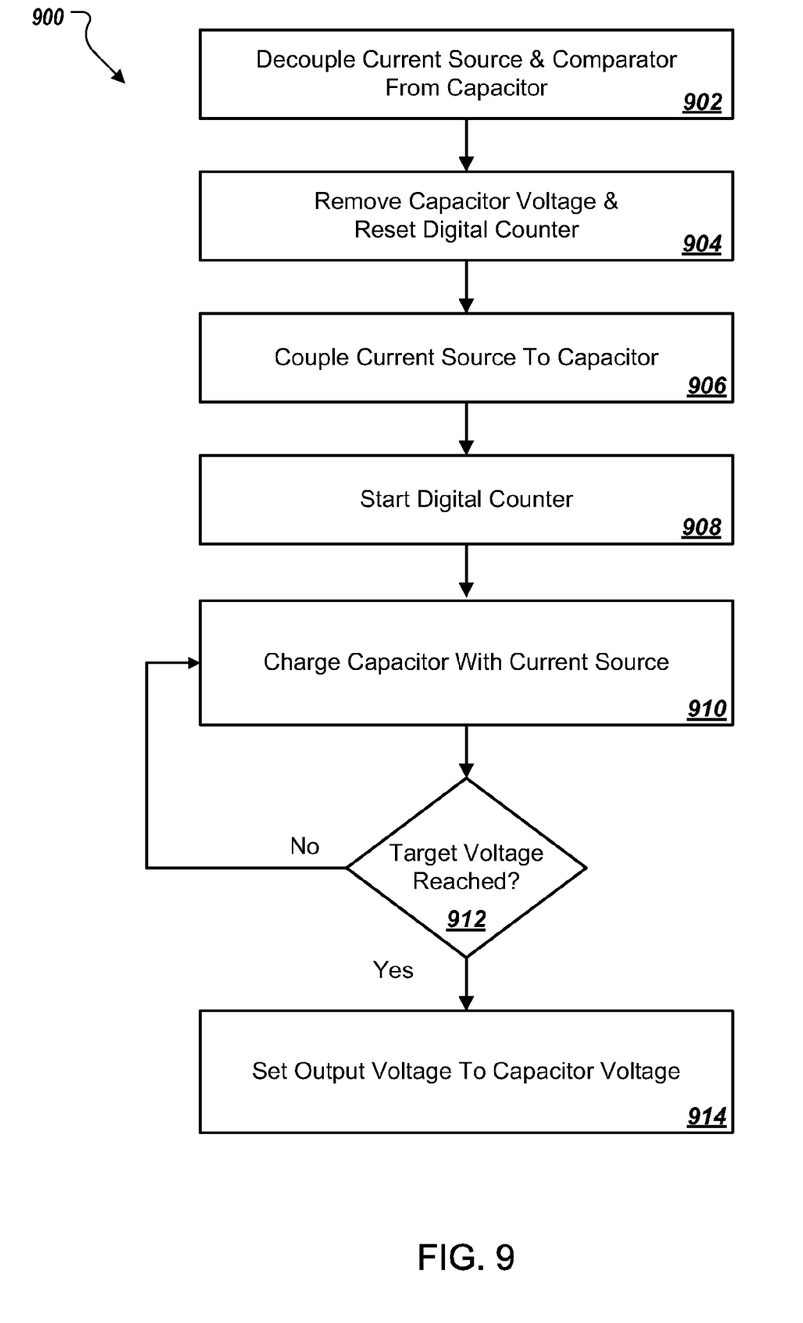
FIG. 9 is a flow diagram of an exemplary conversion process using an integrating DAC architecture.

FIG. 9 is a flow diagram of an exemplary conversion process 900 using an integrating DAC architecture. In some implementations, the process 900 begins by disconnecting the current source and analog comparator from the capacitor (902). The voltage over the capacitor is removed (904). The current source is re-connected to the capacitor (906). The digital counter is started (908). The current source charges the capacitor (910). The charging continues until a target analog voltage is reached (912). The output voltage of the DAC is set to the capacitor voltage (914). For example, a unity gain buffer can be connected to the capacitor to hold the analog voltage at the output of the DAC, as described in reference to FIG. 6.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. An integrating digital-to-analog converter (DAC) circuit, comprising:
   an analog comparator;
   at least two parallel circuit branches connected to an output of the analog comparator, wherein each circuit branch includes:
   a current source;
   a capacitor;
   a first switch operable for connecting the current source to the capacitor for establishing a reference voltage during a calibration stage and for setting a target analog voltage during a conversion stage, the first switch also operable for disconnecting the current source from the capacitor during the calibration phase;
   a second switch operable for connecting an analog comparator to the capacitor for establishing the reference voltage during the calibration stage, the comparator operable for comparing the capacitor voltage with the reference voltage and for triggering when the reference voltage and the capacitor voltage are about equal or differ by a threshold amount;
   a digital counter operable for counting a number of cycles until the analog comparator triggers, wherein the number of cycles establishes a relationship between capacitor voltage and a digital value; and
   a third switch operable for bypassing the capacitor to remove the capacitor charge during the calibration stage and the conversion stage.

2. The converter of claim 1, further comprising:
   a buffer; and
   a fourth switch operable for connecting the capacitor to the buffer to provide an output voltage.

3. The converter of claim 2, where the buffer is an amplifier configured to have unity gain.

4. The converter of claim 1, where the first, second, and third switches are controlled by a state machine.

5. The converter of claim 1, wherein each branch the first, second, third and fourth switches are switched at a different time than in the other circuit branches to provide a continuous output.

6. The converter of claim 1, where the relationship between the capacitor voltage and the digital value is given by $$V_{count} = \frac{V_{reference}}{Digital_{count}},$$

where $V_{count}$ is a voltage change per count of the digital counter, $V_{reference}$ is the capacitor voltage plus an offset error in the analog comparator, and $Digital_{count}$ is a total count stored by the digital counter after the analog comparator triggers.

7. The converter of claim 6, where the digital count $Digital_{count}$ is normalized as follows:

$$Digital_{count\_LSB} = \frac{Digital_{count}}{2^N},$$

where $Digital_{count\_LSB}$ is a number of counts per least significant bit step and N is a resolution.

8. The converter of claim 1, where the target analog output voltage is given by:

$$Digital_{output\_count} \cdot V_{count} = V_{out},$$

where $V_{out}$ is the target analog output voltage after $Digital_{output\_count}$ cycles.

9. The converter of claim 1, where the current source in each branch is a linear current source.

10. A method of digital-to-analog conversion (DAC) for an integrating DAC, comprising:
    in a calibration stage of the DAC:
      removing capacitor voltage from a capacitor;
      connecting a current source to the capacitor;
      starting a digital counter;
      charging the capacitor with the current source until the capacitor voltage is about equal to a reference voltage or differs by a threshold amount;
      establishing a relationship between the capacitor voltage and a digital value based on a count of the digital counter;
    in a conversion stage of the DAC:
      disconnecting the current source from the capacitor;
      removing the capacitor voltage from the capacitor;
      reconnecting the current source to the capacitor;

starting the digital counter;

charging the capacitor with the current source until the capacitor voltage reaches a desired analog voltage based on the count of the digital counter and the relationship established between the capacitor voltage and the digital value; and setting the analog output voltage to the capacitor voltage.

11. The method of claim 10, where setting the analog output voltage, comprises:

connecting the capacitor to a buffer.

12. The method of claim 11, where the buffer is a unity gain amplifier.

13. The method of claim 10, where removing the capacitor voltage from the capacitor, comprises:

shorting the capacitor to ground.

14. The method of claim 10, where charging the capacitor with the current source until the capacitor voltage is about equal to a reference voltage or differs by a threshold amount, comprises:

inputting the capacitor voltage and reference voltage into an analog comparator; and determining that the analog comparator has triggered.

* * * * *

UNITED STATES PATENT AND TRADEMARK OFFICE
CERTIFICATE OF CORRECTION

| | | |
|---|---|---|
| PATENT NO. | : 8,125,366 B2 | Page 1 of 1 |
| APPLICATION NO. | : 12/829354 | |
| DATED | : February 28, 2012 | |
| INVENTOR(S) | : Trond Jarle Pedersen | |

It is certified that error appears in the above-identified patent and that said Letters Patent is hereby corrected as shown below:

Column 3, line 53, please delete "$Digital_{count} LSB$" and insert therefor -- $Digital_{count\_LSB}$ --;

Column 6, line 18 (Claim 5), after "branch" please insert -- of --; and

Column 6, lines 34-35 (Claim 7) please delete "where the digital count $Digital_{count}$ is normalized" and insert therefor -- where the $Digital_{count}$ is normalized --.

Signed and Sealed this
Twenty-fourth Day of April, 2012

David J. Kappos
*Director of the United States Patent and Trademark Office*